United States Patent
Kurokawa et al.

(10) Patent No.: US 10,748,678 B2
(45) Date of Patent: Aug. 18, 2020

(54) SUBSTRATE FOR SUPERCONDUCTING WIRE, PRODUCTION METHOD THEREFOR, AND SUPERCONDUCTING WIRE

(71) Applicants: Toyo Kohan Co., Ltd., Tokyo (JP); Sumitomo Electric Industries, Ltd., Osaka-shi, Osaka (JP)

(72) Inventors: Teppei Kurokawa, Kudamatsu (JP); Yusuke Hashimoto, Kudamatsu (JP); Hironao Okayama, Kudamatsu (JP); Tatsuoki Nagaishi, Osaka (JP); Kotaro Ohki, Osaka (JP); Genki Honda, Osaka (JP)

(73) Assignees: Toyo Kohan Co., Ltd., Tokyo (JP); Sumitomo Electric Industries, Ltd., Osaka-shi, Osaka (JP)

( * ) Notice: Subject to any disclaimer, the term of this patent is extended or adjusted under 35 U.S.C. 154(b) by 510 days.

(21) Appl. No.: 15/522,378

(22) PCT Filed: Oct. 23, 2015

(86) PCT No.: PCT/JP2015/079999
§ 371 (c)(1),
(2) Date: Apr. 27, 2017

(87) PCT Pub. No.: WO2016/068046
PCT Pub. Date: May 6, 2016

(65) Prior Publication Data
US 2017/0338008 A1    Nov. 23, 2017

(30) Foreign Application Priority Data

Oct. 27, 2014   (JP) .................................. 2014-218436

(51) Int. Cl.
*H01B 12/06*    (2006.01)
*H01L 39/24*    (2006.01)
(Continued)

(52) U.S. Cl.
CPC ............. *H01B 12/06* (2013.01); *B32B 15/01* (2013.01); *B32B 15/015* (2013.01); *B32B 33/00* (2013.01);
(Continued)

(58) Field of Classification Search
CPC ............. B23B 15/00–043; B23B 33/00; B23B 2307/514–518; H01B 5/02–16; H01B 12/00–10; H01L 39/2454–2461
See application file for complete search history.

(56) References Cited

U.S. PATENT DOCUMENTS

2009/0053550 A1* 2/2009 Kashima ................. B32B 15/01
428/601
2012/0040840 A1* 2/2012 Okayama ............ H01L 39/2454
505/230
2016/0194750 A1  7/2016 Hashimoto et al.

FOREIGN PATENT DOCUMENTS

CN      102209995     10/2011
EP       2028289      2/2009
(Continued)

OTHER PUBLICATIONS

Varanais et al, "Biaxially Textured Copper and Copper-Iron Alloy Substrates for use in YBa2Cu3O7-x Coated Conductors" Supercond. Sci. Technol. 19 pp. 85-95. (Year: 2006).*
(Continued)

*Primary Examiner* — Colleen P Dunn
(74) *Attorney, Agent, or Firm* — McCarter & English, LLP

(57) ABSTRACT

This invention provides a substrate for a superconducting wire used for manufacturing a superconducting wire with excellent superconductivity and a method for manufacturing the same. Such substrate for a superconducting wire exhibits the crystal orientation of metals on the outermost layer, such as a c-axis orientation rate of 99% or higher, a Δω of 6
(Continued)

degrees or less, and a percentage of an area in which the crystal orientation is deviated by 6 degrees or more from the (001) [100] per unit area of 6% or less.

10 Claims, 4 Drawing Sheets

(51) Int. Cl.
　　　*H01B 5/02*　　　(2006.01)
　　　*H01B 13/00*　　(2006.01)
　　　*B32B 15/01*　　(2006.01)
　　　*B32B 33/00*　　(2006.01)

(52) U.S. Cl.
　　　CPC ............... *H01B 5/02* (2013.01); *H01B 13/00* (2013.01); *H01L 39/2454* (2013.01)

(56) References Cited

FOREIGN PATENT DOCUMENTS

| EP | 2357656 | 8/2011 |
|---|---|---|
| JP | H03275504 | 12/1991 |
| JP | 2009046734 | 3/2009 |
| JP | 2010118246 | 5/2010 |
| JP | 2012229493 | 11/2012 |
| WO | 2015/033808 | 3/2015 |

OTHER PUBLICATIONS

International Search Report based on International Application No. PCT/JP2015/079999, dated Jan. 26, 2016—2 Pages.

Varanasi, Chakrapani, V., et al., "Biaxially textured copper and copper-iron alloy substrates for us in YBa2Cu3O7-x coated conductors", Superconductor Science and Technology, 2006, vol. 19, pp. 85-95.

Supplementary European Search Report based on co-pending European Patent Application No. 15856116.7, dated May 25, 2018, 5 Pages.

Varanasi, Chakrapani, V., et al., "Biaxially Textured Copper and Copper-Iron Alloy Substrates for Use in YBa2Cu3O7-x Coated Conductors", 2006, Superconductor Science and Technology, vol. 19, pp. 85 95.

Japanese Office Action dated Mar. 12, 2019 pertaining to co-pending Japanese Patent Application No. 2016-556541—5 Pages.

* cited by examiner

SUBSTRATE FOR SUPERCONDUCTING WIRE, PRODUCTION METHOD THEREFOR, AND SUPERCONDUCTING WIRE

RELATED APPLICATIONS

This application is a national stage application filed under 35 USC 371 of PCT/JP2015/079999, filed Oct. 23, 2015, which claims the benefit of Japanese Patent Application No. 2014-218436, filed Oct. 27, 2014, all of which is incorporated herein, in its entirety, by reference.

TECHNICAL FIELD

The present invention relates to a substrate for a superconducting wire and a method for manufacturing the same. The present invention also relates to a superconducting wire that is manufactured using the substrate for a superconducting wire.

BACKGROUND ART

A superconducting wire is manufactured by superposing a metal substrate, an intermediate layer composed of one or more layers of oxides, such as cerium oxide ($CeO_2$), yttria-stabilized zirconia (YSZ), and yttrium oxide ($Y_2O_3$), and a superconducting layer (RE123 film, RE: Y, Gd, Ho, or the like) on top of each other.

Methods known as techniques for manufacturing crystal-oriented superconducting layers are: the ion-beam-assisted deposition method (IBAD method) that involves depositing a textured intermediate layer on a non-textured metal substrate such as hastelloy, so as to allow the superconducting layer to take on the texture; and a method that involves the use of a biaxially textured metal substrate, so as to allow the intermediate layer and the superconducting layer to take on the texture (e.g., a method involving the use of a rolling-assisted biaxially textured substrate (RABiTS)). The latter method is more advantageous than the former in view of factors concerning future production efficiency, such as film deposition rate. In order to improve superconductivity, a metal substrate is required to have a high degree of biaxial crystal orientation. The crystal orientation of a metal substrate is evaluated in terms of, for example, the c-axis orientation rate, the $\Delta\omega$ value (an out-of-plane orientation index), and the $\Delta\phi$ value (an in-plane orientation index) of the outermost layer of the substrate.

A substrate known as such a metal substrate (a substrate for a superconducting wire) is produced by superposing crystal-oriented copper on a stainless substrate and further superposing nickel thereon. For example, Patent Document 1 discloses an orientation substrate for the epitaxial film formation in which a metal substrate as a reinforcing material is claded to an orientation metal layer consisting of oriented copper, the orientation metal layer is a metal having an orientation in which both orientation degrees $\Delta\phi$ and $\Delta\omega$ are 5 to 9 degrees, an orientation improvement layer of a thickness of 100-5,000 nm consisting of a nickel plating film is provided on a surface of the orientation metal layer, and the differences between the orientation degrees ($\Delta\phi$ and $\Delta\omega$) on the orientation metal layer surface and the orientation degrees ($\Delta\phi$ and $\Delta\omega$) on the orientation improvement layer surface are 0.1 to 3.0 degrees.

PRIOR ART DOCUMENTS

Patent Documents

Patent Document 1: JP 2012-229493 A

SUMMARY OF THE INVENTION

Objects to be Attained by the Invention

As described above, a conventional substrate for a superconducting wire was manufactured by designating the c-axis orientation rate and the $\Delta\omega$ or $\Delta\phi$ value of the outermost layer of a biaxially crystal-oriented metal substrate at particular levels. It is known that the superconductivity of a superconducting wire is improved as the c-axis orientation rate increases, the $\Delta\omega$ value decreases, or the $\Delta\phi$ value decreases.

Even when, in the past, a superconducting wire was manufactured with the use of a metal substrate such that the crystal orientation of metals on the outermost layer exhibited a sufficient c-axis orientation rate and a sufficient $\Delta\omega$ and $\Delta\phi$ values, it was not possible to consistently achieve superconductivity of such superconducting wire.

Accordingly, it is an object of the present invention to provide a substrate for a superconducting wire used for manufacturing a superconducting wire with excellent superconductivity and a method for manufacturing the same.

Means for Attaining the Objects

The present inventors have conducted concentrated studies in order to attain the above object. As a result, they discovered that a superconducting wire with improved superconductivity could be obtained with the use of a substrate comprising an outermost layer that has been regulated to exhibit the crystal orientation of metals, such as for a particular c-axis orientation rate and a particular $\Delta\omega$ value, and to comprise a given range of an area in which the crystal orientation is deviated by a particular angle or more from the (001) [100]. This has led to the completion of the present invention. Specifically, the present invention is summarized as follows.

(1) A substrate for a superconducting wire, wherein the crystal orientation of metals on the outermost layer exhibits a c-axis orientation rate of 99% or higher, a $\Delta\omega$ of 6 degrees or less, and a percentage of an area in which the crystal orientation is deviated by 6 degrees or more from the (001) [100] per unit area of 6% or less.
(2) The substrate for a superconducting wire according to (1), wherein the crystal orientation of metals on the outermost layer exhibits a $\Delta\varphi$ of 6 degrees or less.
(3) The substrate for a superconducting wire according to (1) or (2), wherein the crystal orientation of metals on the outermost layer exhibits $\Delta\omega$ and $\Delta\varphi$ of less than 5 degrees.
(4) The substrate for a superconducting wire according to any of (1) to (3), wherein the outermost layer is made of copper, nickel, or an alloy thereof.
(5) The substrate for a superconducting wire according to any of (1) to (4), wherein the substrate for a superconducting wire comprises a non-magnetic metal plate and a metal layer having the outermost layer superposed thereon.

(6) The substrate for a superconducting wire according to (5), wherein the non-magnetic metal plate is made of stainless steel or a nickel alloy.

(7) A method for manufacturing the substrate for a superconducting wire according to any of (1) to (6), the method comprising a step of forming, via thermal treatment, a layer exhibiting a c-axis orientation rate of 99% or higher, a Δω of 6 degrees or less, and a percentage of an area in which the crystal orientation is deviated by 6 degrees or more from the (001) [100] per unit area of 6% or less.

(8) A method for manufacturing a substrate for a superconducting wire comprising:

a step of laminating a non-magnetic metal plate and a metal layer through surface activation bonding;

a step of adjusting surface roughness Ra on a metal layer surface of the laminate of the non-magnetic metal plate and the metal layer to 15 nm or less per unit area of 10×10 μm$^2$; and a step of subjecting the metal layer to thermal treatment, so as to achieve a c-axis orientation rate of 99% or higher, a Δω of 6 degrees or less, and a percentage of an area in which the crystal orientation is deviated by 6 degrees or more from the (001) [100] per unit area of 6% or less.

(9) The method according to (8), wherein the step of adjusting surface roughness Ra to 15 nm or less comprises successively performing buffing and light-reduction rolling at a reduction rate of 0% to 1% with the use of a mirror roll in that order.

(10) A superconducting wire comprising the substrate for a superconducting wire according to any of (1) to (6), an intermediate layer superposed thereon, and a superconducting layer superposed thereon.

This description includes part or all of the content as disclosed in the description and/or drawings of Japanese Patent Application No. 2014-218436, which is a priority document of the present application.

Effects of the Invention

According to the present invention, a substrate used for manufacturing a superconducting wire with excellent superconductivity can be obtained by regulating the crystal orientation of metals on the outermost layer to exhibit a c-axis orientation rate of 99% or higher and a Δω of 6 degrees or less and a percentage of an area in which the crystal orientation is deviated by 6 degrees or more from the (001) [100] per unit area to 6% or less.

EMBODIMENTS FOR CARRYING OUT THE INVENTION

Figure 1:
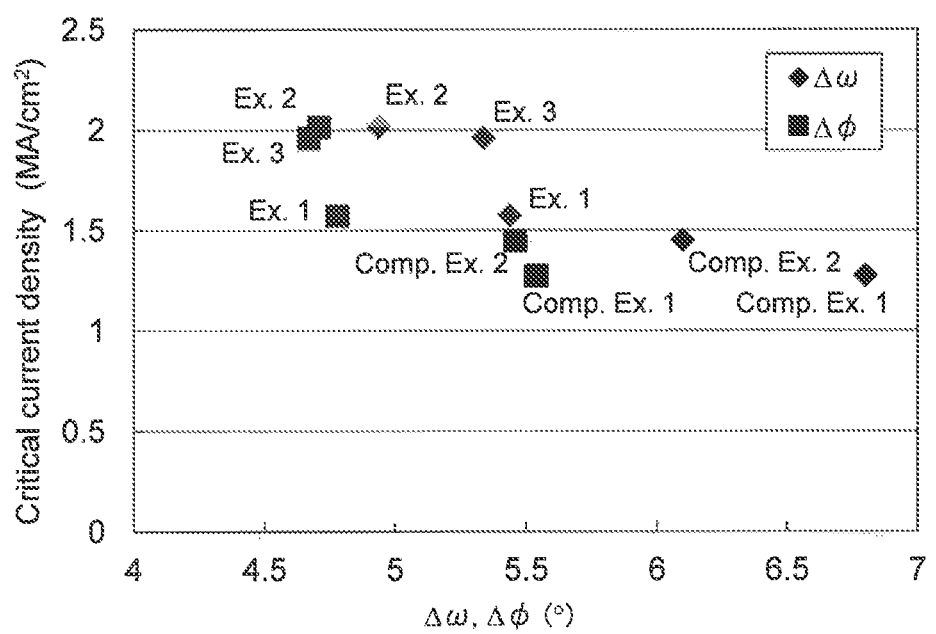
FIG. 1 shows the correlation between the Δω or Δφ and the critical current density observed in the examples.

Hereafter, the present invention is described in detail.
1. Substrate for Superconducting Wire The substrate for a superconducting wire according to the present invention is characterized by the features described below. That is, such substrate exhibits a crystal orientation of metals on the outermost layer, such as a c-axis orientation rate of 99% or higher, an in-plane orientation degree (Δω) of 6 degrees or less, and a percentage of an area in which the crystal orientation is deviated by 6 degrees or more from the (001) [100] per unit area (1 mm$^2$) is 6% or less.

The symbol "Δω" represents an out-of-plane orientation degree. Since a Δω value is an average angle of rotation around RD [100] and TD [010] of crystal grains, the degree of deviation of each crystal grain is not apparent, such value does not serve as an indicator of a percentage of an area in which the crystal orientation is deviated by a particular angle or more from the (001) [100].

In the present invention, the expression "a percentage of an area in which the crystal orientation is deviated by a particular angle or more from the (001) [100]" refers to a percentage of a crystal area in which the angular difference from the (001) [100] is the particular angle or more when observed via the EBSD method. The term "EBSD (electron back scatter diffraction) method" refers to a technique of analyzing the crystal orientation by means of reflected electron diffraction of Kikuchi lines (i.e., the Kikuchi pattern) generated when an electron beam is applied to the sample under a scanning electron microscope (SEM). In general, an electron beam is applied to the surface of the outermost layer, and the information obtained upon electron beam application is directional information for up to a depth of several tens of nanometers, to which the electron beam penetrates; that is, the directional information of the outermost layer.

The substrate for a superconducting wire according to the present invention has the outermost layer, which exhibits a percentage of an area in which the crystal orientation of metals is deviated by 6 degrees or more from the (001) [100] per unit area is 6% or less, and preferably less than 5%. By regulating the crystal orientation of metals of the outermost layer of the substrate to such level, the superconductivity of a superconducting wire obtained with the use of such substrate can be improved.

On the substrate for a superconducting wire according to the present invention, preferably, a percentage of an area in which the crystal orientation of metals is deviated by 10 degrees or more from the (001) [100] per unit area is less than 1%, and a percentage of an area in which the crystal orientation is deviated by 15 degrees or more from the (001) [100] per unit area is less than 0.3%, on the outermost layer. Thus, the resulting superconducting wire can achieve excellent superconductivity.

The substrate for a superconducting wire according to the present invention exhibits the crystal orientation of metals on the outermost layer, such as a Δω of 6 degrees or less and preferably less than 5 degrees. Thus, the resulting superconducting wire can achieve excellent superconductivity.

The substrate for a superconducting wire according to the present invention exhibits the crystal orientation of metals on the outermost layer, such as a Δφ of preferably 6 degrees or less, and more preferably less than 5 degrees. Thus, the resulting superconducting wire can achieve excellent superconductivity.

The symbol "Δφ" represents an in-plane orientation degree. A "Δφ" value is an average angle of rotation around ND [001] of crystal grains. The symbol "Δω" represents an out-of-plane orientation degree, which is an average angle of rotation around RD [100] and TD [010] of crystal grains. Therefore, there is no correlation between Δω and Δφ. Specifically, Δω is not directly correlated with Δφ; that is, there is no proportional correlation therebetween. Since Δφ and Δω values are averages and the degree of deviation of each crystal grain is not apparent, such value does not serve as an indicator of a percentage of an area in which the crystal orientation is deviated by a particular angle or more from the (001) [100].

The substrate for a superconducting wire according to the present invention preferably exhibits the crystal orientation of metals on the outermost layer, such as a Δω of 6 degrees or less, a Δφ of 6 degrees or less, and a percentage of an area in which the crystal orientation is deviated by 6 degrees or more from the (001) [100] per unit area of 6% or less. More preferably, the substrate exhibits the crystal orientation of metals on the outermost layer, such as a Δω of less than 5 degrees, a Δφ of less than 5 degrees, and a percentage of an area in which the crystal orientation is deviated by 6 degrees or more from the (001) [100] per unit area of less than 5%. Thus, the resulting superconducting wire can achieve excellent superconductivity.

Concerning Δω, Δφ and a percentage of an area in which the crystal orientation is deviated by 6 degrees or more from the (001) [100] on the outermost layer of the substrate for a superconducting wire according to the present invention, an area of 1 mm$^2$ on the substrate is subjected to each EBSD analysis, arbitrary 30 points are subjected to EBSD to assay the crystal orientation, and the average Δω and Δφ values and the average percentage of an area in which the crystal orientation is deviated by 6 degrees or more from the (001) [100] are then determined based on the assay results. It is sufficient if the measured average values and the average values falling within 2σ of a standard error a are within a given range of values.

The outermost layer of the substrate for a superconducting wire according to the present invention is preferably made of a metal of a face-centered cubic lattice structure. For example, the outermost layer is composed of one or more members selected from the group consisting of nickel, copper, silver, aluminum, and palladium, or an alloy thereof. Because of ease of achieving a higher degree of biaxial crystal orientation and satisfactory lattice matching with the intermediate layer, the outermost layer is preferably made of copper, nickel, or an alloy thereof.

Concerning the substrate for a superconducting wire according to the present invention, it is sufficient for the outermost layer to have the crystal orientation and the crystal orientation of metals described above. In addition, another non-oriented metal layer may be present as the underlying layer thereof.

The thickness of the substrate for a superconducting wire according to the present invention is not particularly limited, and it is preferably from 50 μm to 200 μm. When the thickness of the substrate is less than 50 μm, the substrate cannot retain its mechanical strength. When the thickness is more than 200 μm, in contrast, the substrate cannot retain the processability required for the processing of a superconducting wire.

According to an embodiment of the present invention, the substrate for a superconducting wire according to the present invention comprises a non-magnetic metal plate and a crystal-oriented metal layer superposed on the non-magnetic metal plate (hereafter, it is occasionally referred to as a "crystal-oriented metal layer"). A metal layer may be provided on one surface of the non-magnetic metal plate, or two metal layers may be provided on both surfaces of the metal plate.

The term "non-magnetic" used herein refers to a state in which the relevant metal plate is not ferromagnetic at 77 K or higher; that is, a Curie point or a Neel point thereof exists at 77 K or below and the same is paramagnetic or antiferromagnetic at 77 K or higher. As such a non-magnetic metal plate, a nickel alloy or austenitic stainless steel is preferably used since it has excellent strength and plays a role as a reinforcing material.

In general, austenitic stainless steel is in a non-magnetic state at room temperature. In such a case, the metal texture is 100% in the austenite (γ) phase. When an (α') phase transformation point (Ms point) of a martensite, which is ferromagnetic, is at 77 K or higher, in contrast, an α' phase, which is ferromagnetic at a liquid nitrogen temperature, may appear. Accordingly, an austenitic stainless steel plate with an Ms point designed at 77 K or below is preferably used as a substrate for a superconducting wire to be used at a temperature below a liquid nitrogen temperature (77 K).

As a γ-stainless steel plate, a plate material, such as SUS316, SUS316L, SUS310, or SUS305, is preferably used because such material has a stable γ phase with an Ms point designed to be sufficiently lower than 77 K, and it is widely available at a relatively low cost. A metal plate having a thickness of 20 μm or more is generally applicable herein. From the viewpoint of the reduced thickness and strength of a superconducting wire, a thickness of a metal plate is preferably 50 μm to 100 μm, although the thickness is not limited to such range.

The metal layer used for the substrate for a superconducting wire according to the present invention was cold-rolled preferably at a reduction rate of 90% or higher and more preferably 95% to less than 99% at the time of final rolling, it is not subjected to thermal treatment for recrystallization after cold-rolling, and it thus retains rolled texture developed as a result of cold rolling. When a reduction rate is less than 90%, metal may not be oriented in the later process of thermal treatment. When a reduction rate is 99% or higher, a Δω of the outermost layer of the substrate for a superconducting wire cannot be adjusted to 6 degrees or less, and the resulting superconducting wire cannot achieve excellent superconductivity.

The metal layer can be made of a metal that is crystal-oriented by rolling, followed by thermal treatment. For example, such metal can be at least one member selected from the group consisting of nickel, copper, silver, and aluminum, or an alloy thereof. Because of ease of achieving a higher degree of biaxial crystal orientation and satisfactory lattice matching with the intermediate layer, the metal layer is preferably made of copper or a copper alloy.

A metal layer may contain a very small amount (about 1% or less) of an element in order to further improve biaxial crystal orientation by the thermal treatment described below. Examples of such an additional element include one or more types of elements selected from among Ag, Sn, Zn, Zr, O, and N. These additional elements and metals contained in the metal layer form a solid solution. If the amount thereof to be added exceeds 1%, impurities such as oxides other than a solid solution increase. This may adversely affect the crystal orientation.

A metal foil can be preferably used as a metal layer. Such metal foil can be generally obtained. Examples thereof include a high-reduction rolled copper foil (HA foil) manufactured by JX Nippon Mining & Metals Corp. and a high-reduction rolled copper foil (HX foil) manufactured by SH Copper Products Co., Ltd.

A thickness of a metal layer is generally from 7 μm to 70 μm, and preferably 15 um to 70 μm, so as to maintain the strength of the metal layer and improve the processability at the time of later processing of a superconducting wire.

In order to adjust a Δω to 6 degrees or less and a percentage of an area in which the crystal orientation of metals is deviated by 6 degrees or more from the (001) [100] per unit area to 6% or less on the outermost layer of the substrate for a superconducting wire according to the present invention, for example, a metal layer, such as a copper foil, with a degree of gloss of less than 50, and preferably from 30 to 45, can be used. In the present invention, the "degree of gloss" is the L value determined by measuring the L*, a*, and b*, using a colorimeter, of the metal layer before it is superposed on the non-magnetic metal plate and after it is rolled in the method of producing the substrate described below.

The substrate for a superconducting wire according to the present invention may comprise a protective layer formed on a crystal-oriented metal layer.

A protective layer used for the substrate for a superconducting wire according to the present invention is preferably made of a metal having a face-centered cubic lattice structure, such as nickel, palladium, silver, or an alloy thereof, with nickel or a nickel alloy being more preferable, for the following reasons. That is, a nickel-containing protective layer has excellent acid resistance. In the presence of a protective layer, distortion of crystal orientation, which may occur upon formation of an oxide layer of metals contained in the crystal-oriented metal layer at the time of formation of an intermediate layer made of $CeO_2$ or the like on the protective layer, can be prevented. As an element to be contained in a nickel, palladium, or silver alloy, an element that leads to decreased magnetism is preferable, and examples thereof include Cu, Sn, W. and Cr. In addition, impurities may be contained, as long as they do not adversely affect the crystal orientation.

When a protective layer is too thin, metals in the crystal-oriented metal layer may diffuse onto the surface of the protective layer and oxidize the surface at the time when an intermediate layer and a superconducting layer are superposed on the protective layer during the production of the superconducting wire. When a protective layer is too thick, in contrast, the protective layer becomes deteriorated in crystal orientation, and the plating distortion increases. The thickness of a protective layer is appropriately determined in view of these factors. Specifically, a thickness is preferably from 1 μm to 5 μm.

2. Method for Manufacturing Substrate for Superconducting Wire

The substrate for a superconducting wire according to the present invention can be manufactured by a method comprising a step of forming, via thermal treatment, a layer exhibiting a c-axis orientation rate of 99% or higher, a Δω of 6 degrees or less, and a percentage of an area in which the crystal orientation is deviated by 6 degrees or more from the (001) [100] per unit area of 6% or less.

According to an embodiment of the present invention, a layer exhibiting a c-axis orientation rate of 99% or higher, a Δω of 6 degrees or less, and a percentage of an area in which the crystal orientation is deviated by 6 degrees or more from the (001) [100] per unit area of 6% or less formed via thermal treatment is a crystal-oriented metal layer.

Thermal treatment is performed at, for example, 150° C. or higher. While the duration of thermal treatment varies depending on temperature, for example, thermal treatment may be performed for 1 to 10 hours at 400° C., and for several seconds to about 5 minutes at a high temperature of 700° C. or higher. If the temperature for thermal treatment is too high, a metal layer is more likely to undergo secondary recrystallization, and the crystal orientation deteriorates. Accordingly, thermal treatment is performed at 150° C. to 1000° C. If a substrate is exposed to an excessively high temperature of 600° C. to 900° C. in the later step of forming an intermediate layer or superconducting layer, thermal treatment is preferably carried out at 600° C. to 900° C. More preferably, thermal treatment is performed in a stepwise manner, such that thermal treatment is first performed at a low temperature and then at a high temperature. Thus, the degree of crystal orientation and surface roughness of the crystal-oriented metal layer and the protective layer that would be formed later can be improved. It is particularly preferable that thermal treatment be first performed at 200° C. to 400° C. and then at 800° C. to 900° C. It is more preferable that thermal treatment be first performed at 275° C. to 325° C. and then at 850° C. to 900° C.

According to an embodiment of the present invention, a substrate for a superconducting wire is manufactured by a method comprising steps of: laminating a non-magnetic metal plate and a metal layer via surface activation bonding; adjusting surface roughness on the metal layer surface of the laminate of the non-magnetic metal plate and the metal layer per unit area of 10×10 μm² to 15 nm or less (Ra; average surface roughness); and subjecting a metal layer to thermal treatment, so as to adjust the c-axis orientation rate to 99% or higher, the Δω to 6 degrees or less, and the percentage of an area in which the crystal orientation is deviated by 6 degrees or more from the (001) [100] per unit area to 6% or less.

In the method for manufacturing the substrate for a superconducting wire according to the present invention, a Δω can be adjusted to 6 degrees or less and a percentage of an area in which the crystal orientation is deviated by 6 degrees or more from the (001) [100] per unit area can be adjusted to 6% or less on the outermost layer of the resulting substrate for a superconducting wire by, for example, adjusting the degree of gloss of a metal layer, such as a copper foil. The degree of gloss of a metal layer is, for example, less than 50, and preferably from 30 to 45. In the present invention, the "degree of gloss" is the L value determined by measuring the L*, a*, and b*, using a colorimeter, of the metal layer before it is superposed on the non-magnetic metal plate and after it is rolled. In addition to the method of adjusting the degree of gloss of the metal layer, a Δω can be adjusted to 6 degrees or less and a percentage of an area in which the crystal orientation is deviated by 6 degrees or more from the (001) [100] per unit area can be adjusted to 6% or less on the outermost layer of the substrate by adjusting a reduction rate of a metal layer. At the time of final rolling, a reduction rate of a metal layer is preferably 90% or higher, and more preferably 95% to less than 99%. In addition to the method of adjusting the degree of gloss or the reduction rate of the metal layer described above, for example, the intensity of the copper orientation in the rolled texture of the metal layer may be increased, and the intensity of the brass orientation therein may be decreased. Thus, the Δω can be adjusted to 6 degrees or less and the percentage of an area in which the crystal orientation is deviated by 6 degrees or more from the (001) [100] per unit area can be adjusted to 6% or less on the outermost layer of the thermally treated substrate.

In the step of laminating a non-magnetic metal plate and a metal layer through surface activation bonding in the method for manufacturing the substrate for a superconducting wire according to the present invention, the surface of the non-magnetic metal plate and that of the metal layer are subjected to sputter etching treatment, respectively, so as to remove the surface adsorption layer and the surface oxide film for surface activation, and the activated two surfaces are then bonded to each other by cold rolling. Thus, a non-magnetic metal plate is bonded to a metal layer that maintains a rolled texture.

In surface activation bonding, specifically, a non-magnetic metal plate and a metal layer are prepared as elongated coils having a width of 150 mm to 600 mm, and the two surfaces to be bonded are first activated and then subjected to cold rolling.

The surface activation treatment is carried out by performing sputter etching treatment wherein the non-magnetic metal plate and the metal layer having surfaces to be bonded are designated as electrodes at one side, which are connected to a ground, respectively, a glow discharge is generated by applying an AC current of 1 to 50 MHz to a region between such electrodes and the other electrodes, which are supported in an insulated manner, and an area of the electrode that is exposed to the plasma generated by the glow discharge is ⅓ or less of the area of the other electrode. As an inert gas, argon, neon, xenon, krypton or a gas mixture containing at least one kind of gas selected from among such gases is applicable.

In the sputter etching treatment, surfaces to be bonded of the non-magnetic metal plate and the metal layer are subjected to sputtering by an inert gas, so that at least surface adsorption layers are removed. In addition, surface oxide films may be removed. The surfaces to be bonded are activated by this treatment. During this sputter etching treatment, the electrodes connected to the ground are in the form of cooling rolls. Thus, the elevation of temperature of the respective materials to be conveyed is prevented.

Thereafter, the non-magnetic metal plate and the metal layer are continuously conveyed to a pressure bonding roll step, so that the activated surfaces are pressure-bonded to each other. When an $O_2$ gas or the like exists in the pressure bonding atmosphere, the activated surfaces are oxidized again during the conveyance, and the adhesion therebetween is adversely affected. A laminate, which is formed by bonding the non-magnetic metal plate and the metal layer to each other in close contact through the above-mentioned pressure bonding step, is conveyed to a winding step, and it is wound in this step.

In the above-mentioned sputter etching step, materials adsorbed onto the surfaces to be bonded are completely removed; however, it is not necessary to completely remove a surface oxidized layer for the following reasons. That is, even if the oxidized layer remains on the entire surface, the bonding property between the non-magnetic metal plate and the metal layer can be maintained by exposing the base by making use of friction on the surfaces to be bonded in the cold pressure bonding step.

If an oxidized layer is to be completely removed by dry etching, a high plasma output or etching for a long period of time becomes necessary, and the temperature of a material is elevated disadvantageously. When the temperature of the metal layer is elevated to a level equivalent to or higher than the recrystallization initiation temperature of metals in the metal layer, the metal layer undergoes recrystallization during sputter etching treatment. As a result, the crystal orientation of the metal layer is determined prior to bonding.

When the metal layer on which crystals are oriented is rolled, distortion is introduced into the metal layer, and the biaxial crystal orientation of the metal layer deteriorates. In the sputter etching step, accordingly, it is necessary to maintain the temperature of the metal layer at a temperature below the metal recrystallization initiation point. When a copper foil is used as a metal layer, for example, the temperature of the copper foil is maintained below 150° C. The temperature of the copper foil is preferably maintained at 100° C. or below, so as to maintain the metal texture of the metal layer in the form of the rolled texture.

In the treatment whereby sputter etching is applied to the non-magnetic metal plate, also, treatment with a high plasma output or the elevation of temperature of the metal plate to the metal recrystallization initiation point or higher via treatment for a long period of time may lead to the elevated temperature of the metal layer due to the contact between the metal plate and the metal layer at the time of rolling. The recrystallization of the metal layer may also take place simultaneously with the rolling, and the biaxial crystal orientation may deteriorate.

In the sputter etching step of the non-magnetic metal plate, accordingly, the temperature of the metal plate is preferably maintained below the recrystallization initiation point of metals in the metal layer. When a copper foil is used as a metal layer, for example, the temperature of the copper foil is maintained below 150° C. The temperature of the metal layer is preferably maintained within a range of room temperature to 100° C.

After the surface of the non-magnetic metal plate and that of the metal layer are activated in the manner described above, they are bonded to each other using pressure rolls in vacuum. In such cases, a higher degree of vacuum is preferable from the viewpoint of the prevention of re-adsorption to the surface, and a degree of vacuum from $10^{-5}$ Pa to $10^{-2}$ Pa is sufficient.

In addition, the bonding strength between the non-magnetic metal plate and the metal layer is lowered due to oxygen re-adsorption to the surface of the non-magnetic metal plate and to that of the metal layer. Accordingly, it is also preferable to perform the bonding using pressure rolls in a non-oxidizing atmosphere, such as in an inert gas atmosphere such as that of an Ar gas.

Pressure application using pressure rolls is performed to ensure a bonded area of a bonding boundary between the non-magnetic metal plate and the metal layer as well as to expose a base by peeling a partial surface oxidized film layer by making use of friction that occurs in the bonding boundary at the time of rolling reduction. It is preferable to apply a pressure of 300 MPa or more. Both the non-magnetic metal plate and the metal layer are particularly hard materials. Accordingly, it is preferable to apply a pressure of 600 MPa to 1.5 GPa. A pressure exceeding 1.5 GPa may be applied, and it is confirmed that the crystal orientation does not deteriorate after thermal treatment at a reduction rate of up to 30%. It is preferable that pressure be applied to adjust the reduction rate to below 5%. With the application of pressure that results in a reduction rate exceeding 30%, cracks occur on the surface of the metal layer, and the crystal orientation of the crystal-oriented metal layer deteriorates after rolling and thermal treatment.

The laminate of the non-magnetic metal plate and the metal layer prepared by surface activation bonding described above (hereafter, it is also simply referred to as the "laminate") is treated to adjust surface roughness Ra per unit area of 10×10 µm² on the metal layer surface (hereafter, it is also referred to as "surface roughness Ra") to 15 nm or less (the process of surface roughness adjustment). In the present invention, surface roughness of the laminate can be measured under an atomic force microscope (AFM). Through this process, the substrate of the present invention having specific crystal orientation can be obtained, and the crystal orientation of an intermediate layer and that of a superconducting compound layer to be further superposed by epitaxial growth onto a protective layer can be satisfactorily maintained. In general, a reduction rate of the laminate after the treatment is less than 5%.

Surface roughness Ra of the metal layer surface of the laminate can be adjusted to 15 nm or less by any method. Examples of methods include, but are not particularly limited to, reduction using a pressure roll, such as a mirror roll, buffing, electropolishing, and electropolishing using electrolytic abrasive grains. Two or more such methods may be employed in combination. From the viewpoint of superconductivity and surface roughness of the resulting superconducting wire and productivity, it is particularly preferable that buffing be carried out in combination with light-reduction rolling with the use of a mirror roll. A mirror roll is a type of pressure roll having a mirror-like processed surface.

When the process of surface roughness adjustment is carried out via buffing in combination with light-reduction rolling with the use of a mirror roll, it is preferable that buffing and light-reduction rolling at a reduction rate of 0% to 1% with the use of a mirror roll be successively carried out in that order. Specifically, it is preferable that surface roughness Ra be first reduced to 25 nm or less via buffing and further reduced to 15 nm or less via light-reduction rolling at a reduction rate of 0% to 1% with the use of a mirror roll.

A type of abrasive grains used for buffing can be adequately selected. Specifically, buffing may be first carried out with the use of SiC abrasive grains and then with the use of $Al_2O_3$ abrasive grains. Thus, surface roughness Ra can be reduced to 25 nm or less. A process of buffing may be divided into multiple stages and performed a plurality of times.

It is preferable that light-reduction rolling be carried out with the use of a mirror roll having surface roughness Ra of 0.01 μm or less. In general, light-reduction rolling with the use of a mirror roll is carried out at a pressure of 500 MPa to 900 MPa. This treatment may be repeated until surface roughness reaches a given level. In order to adjust surface roughness Ra to 15 nm or less, light-reduction rolling with the use of a mirror roll is preferably carried out two or more times.

According to an embodiment of the present invention, the process of surface roughness adjustment comprises buffing with the use of SiC abrasive grains, followed by buffing with the use of $Al_2O_3$ abrasive grains, so as to reduce the surface roughness Ra to 25 nm or less. Thereafter, light-reduction rolling at a reduction rate of 0% to 1% is carried out with the use of a mirror roll, so as to reduce surface roughness Ra to 15 nm or less.

In the process of surface roughness adjustment, surface roughness Ra1 per unit length of 10 μm in a rolling direction (i.e., a longitudinal direction) on the metal layer surface of the laminate is preferably adjusted to less than 5 nm, and more preferably to less than 3 nm. Thus, the resulting superconducting wire can be prevented from a significant decrease in superconductivity due to block of the superconducting current, and the superconducting wire can achieve higher superconductivity. Surface roughness Ra1 can be preferably reduced to less than 5 nm by performing buffing with the use of SiC abrasive grains and then buffing with the use of $Al_2O_3$ abrasive grains.

In the process of surface roughness adjustment, surface roughness Ra2 per unit length of 10 μm in the direction perpendicular to the pressure-rolled direction on the metal layer surface of the laminate is preferably adjusted to less than 21 nm and more preferably to less than 15 nm. It is difficult to reduce surface roughness Ra2 in the direction perpendicular to the pressure-rolled direction by means of the buffing described above alone. In addition, Ra2 occasionally increases disadvantageously because of a polishing mark referred to as a "buff line." While the influence of increased Ra2 is not as significant as that of Ra1, such increase may adversely affect superconductivity. Even if Ra1 is small but Ra2 or Rzjis is large (i.e., Rzjis is a ten-point average roughness determined by sampling the reference length from the roughness curve in the direction of its mean line, calculating the sum of the average value of absolute values of the heights of five highest profile peaks (Yp) and the depths of five deepest profile valleys (Yv) measured in the vertical magnification direction from the mean line of this sampled portion, and expressing the sum in micrometer (μm)), at the time of protective layer formation by means of electrolytic Ni plating, Ni crystals may first be precipitated from the convex, and surface roughness may deteriorate to some extent. Surface roughness Ra2 can be reduced to less than 21 nm by performing buffing, followed by light-reduction rolling at a reduction rate of 0% to 1% with the use of a mirror roll.

The metal layer of the laminate treated to adjust surface roughness Ra per unit area of 10×10 μm² on the metal layer surface to 15 nm or less is subjected to thermal treatment, so as to achieve a c-axis orientation rate of 99% or higher, a Δω of 6 degrees or less, and a percentage of an area in which the crystal orientation is deviated by 6 degrees or more from the (001) [100] per unit area of 6% or less. Thermal treatment is performed at, for example, 150° C. or higher as described above. While the duration of thermal treatment varies depending on temperature, for example, thermal treatment may be performed for 1 to 10 hours at 400° C., and for several seconds to about 5 minutes at a high temperature of 700° C. or higher. If the temperature for thermal treatment is too high, a metal layer is more likely to undergo secondary recrystallization, and the crystal orientation deteriorates. Accordingly, thermal treatment is performed at 150° C. to 1000° C. If a substrate is exposed to an excessively high temperature of 600° C. to 900° C. in the later step of forming an intermediate layer or superconducting layer, thermal treatment is preferably carried out at 600° C. to 900° C. More preferably, thermal treatment is performed in a stepwise manner, such that thermal treatment is first performed at a low temperature and then at a high temperature. Thus, the degree of crystal orientation and surface roughness of the crystal-oriented metal layer and the protective layer that would be formed later can be improved. Specifically, it is preferable that thermal treatment be first performed at 200° C. to 400° C. and then at 800° C. to 900° C. It is more preferable that thermal treatment be first performed at 250° C. to 325° C. and then at 850° C. to 900° C.

As described above, the substrate for a superconducting wire according to the present invention can comprise a protective layer formed on a crystal-oriented metal layer. The laminate of the biaxially crystal-oriented metal layer resulting from thermal treatment of the metal layer and the non-magnetic metal plate may be plated, so that a protective layer maintaining the crystal orientation of the crystal-oriented metal layer can be formed on the crystal-oriented metal layer.

Plating can be performed under appropriate conditions that would minimize the plating distortion of a protective layer. The term "plating distortion" used herein refers to the degree of distortion that takes place within a plated film when a base such as a metal plate is plated. When a layer made of nickel is formed as a protective layer, for example, plating may be performed with the use of a Watts bath or a sulfamate bath, which has been known as a plating bath. Use of a sulfamate bath is particularly preferable because the plating distortion of the protective layer can be easily reduced. While a preferable composition of a plating bath is as described below, the composition is not limited thereto.
(Watts Bath)
Nickel sulfate: 200 to 300 g/l
Nickel chloride: 30 to 60 g/l
Boric acid: 30 to 40 g/l
pH: 4 to 5
Bath temperature: 40° C. to 60° C.
(Sulfamate Bath)
Nickel sulfamate: 200 to 600 g/l
Nickel chloride: 0 to 15 g/l
Boric acid: 30 to 40 g/l
Additive: Appropriate quantity
pH: 3.5 to 4.5
Bath temperature: 40° C. to 70° C.

Current density when plating is performed is not particularly limited and it is appropriately determined in view of a balance thereof with the time required for plating. When a plated film of 2 µm or more is formed as a protective layer, for example, low current density may result in a longer period of time required for plating, a decreased line speed to secure the time therefor, lower productivity, and difficulty in plating control. In general, accordingly, current density is preferably 10 A/dm$^2$ or more. Also, the upper limit of current density differs depending on the type of plating bath, and it is not particularly limited. For example, current density is preferably 25 A/dm$^2$ or less in the case of a Watts bath, and it is preferably 35 A/dm$^2$ or less in the case of a sulfamate bath. When current density exceeds 35 A/dm$^2$, in general, a good crystal orientation may not be obtained due to so-called "plating burning."

The thus formed protective layer may undergo the formation of micropits on the surface depending on plating conditions and the like. In such a case, the surface can be smoothed by leveling via further thermal treatment after plating, if necessary. In such a case, thermal treatment temperature is preferably, for example, from 700° C. to 1000° C.

Surface roughness of the plated protective layer often becomes larger than the surface roughness of the copper layer before plating. After the formation of the protective layer, however, polishing cannot be performed because the crystal orientation of the protective layer may be broken. Through regulation of plating conditions, accordingly, surface roughness Ra (Ni) per unit area of 10×10 µm$^2$ is preferably adjusted to 20 nm or less, and more preferably 16 nm or less.

3. Superconducting Wire

An intermediate layer and a superconducting layer may be superposed in that order on the substrate for a superconducting wire as described above in accordance with a conventional technique, so that a superconducting wire can be manufactured. Specifically, an intermediate layer of $CeO_2$, YSZ, $SrTiO_3$, MgO, $Y_2O_3$, or the like may be epitaxially deposited using a means such as a sputtering method on the outermost layer of the substrate for a superconducting wire, and a Y123-based superconducting compound layer or the like may be further deposited thereon by, for example, the pulsed laser deposition (PLD) method, the metal organic deposition (MOD) method, or the metal organic chemical vapor deposition (MOCVD) method. Thus, a superconducting wire can be obtained. A plurality of intermediate layers may be formed. If necessary, a protective film made of Ag, Cu, or the like may further be provided on the superconducting compound layer.

EXAMPLES

Hereafter, the present invention is described in greater detail with reference to the examples and the comparative examples, although the technical scope of the present invention is not limited to these examples.

1. Substrate for Superconducting Wire

Example 1

SUS316L (thickness: 100 µm) was used as a non-magnetic metal plate, and a copper foil (thickness: 18 µm) exhibiting a degree of gloss of 42.8 measured with a colorimeter (NR-3000, Nippon Denshoku Industries, Co., Ltd.) after it had been rolled at a reduction rate of 98.6% was used as a metal layer. SUS316L and the copper foil were bonded to each other via surface activation at room temperature using a surface activation bonding apparatus. Thus, a laminate of SUS316L and the copper foil was formed.

When conducting surface activation bonding, sputter etching was applied to the bonded surfaces at 0.1 Pa with a plasma output of 200 W for 20 seconds. Thus, layers of materials adsorbed onto the surface of SUS316L and that of the copper foil were completely removed. A pressure of 600 MPa was applied with the use of pressure rolls.

Surface roughness Ra of the copper foil surface of the laminate was reduced to 25 nm or less via buffing with SiC and buffing with $Al_2O_3$, the laminate was pressure-rolled three times at a pressure of 600 MPa with the use of a mirror roll with surface roughness Ra of less than 0.01 µm, and surface roughness Ra of the copper foil surface of the laminate was thus reduced to 15 nm or less. Thereafter, the laminate was subjected to thermal treatment in a continuous thermal treatment furnace at 300° C. for an annealing time of 5 minutes and then at 875° C. for an annealing time of 5 minutes. Thus, crystals of the copper foil were biaxially oriented. The copper foil surface was analyzed via EBSD after thermal treatment, and the percentage of the area in which the crystal orientation is deviated by 6 degrees or more from the (001) [100] was found to be 5.2%.

Subsequently, nickel was plated onto the copper foil using the laminate as a cathode. Thus, a substrate comprising a nickel layer as a protective layer was obtained. The composition of the plating bath is as described below. In addition, the nickel plating thickness was set to 2.5 µm, the plating bath temperature was set at 60° C., and the pH level of the plating bath was set at 4.
(Sulfamate Bath)
Nickel sulfamate: 450 g/l
Nickel chloride: 5 g/l Boric acid: 30 g/l
Additive: 5 ml/l Example 2

The procedure of Example 1 was performed, except that a copper foil (thickness: 48 μm) rolled at a reduction rate of 96.8% and exhibiting a degree of gloss of 34.2 was used as the metal layer. On the thermally treated copper foil surface prior to the formation of a protective layer, the percentage of the area in which the crystal orientation is deviated by 6 degrees or more from the (001) [100] was 2.2%.

Example 3

The procedure of Example 1 was performed, except that a copper foil (thickness: 48 μm) rolled at a reduction rate of 96.8% and exhibiting a degree of gloss of 39.4 was used as the metal layer. On the thermally treated copper foil surface prior to the formation of a protective layer, the percentage of the area in which the crystal orientation is deviated by 6 degrees or more from the (001) [100] was 3.2%.

Comparative Example 1

The procedure of Example 1 was performed, except that a copper foil (thickness: 18 μm) rolled at a reduction rate of 98.6% and exhibiting a degree of gloss of 55.3 was used as the metal layer. On the thermally treated copper foil surface prior to the formation of a protective layer, the percentage of the area in which the crystal orientation is deviated by 6 degrees or more from the (001) [100] was 12.7%.

Comparative Example 2

The procedure of Example 1 was performed, except that a copper foil (thickness: 18 μm) rolled at a reduction rate of 98.6% and exhibiting a degree of gloss of 55.1 was used as the metal layer. On the thermally treated copper foil surface prior to the formation of a protective layer, the percentage of the area in which the crystal orientation is deviated by 6 degrees or more from the (001) [100] was 10.0%.

The crystal orientation and the crystal orientation of the outermost layers of the substrates obtained in Examples 1 to 3 and Comparative Examples 1 and 2 were determined.
(1) Percentage of Area in which Crystal Orientation is Deviated by 6 Degrees or More from (001) [100]

The obtained substrate was analyzed with the use of EBSD (SEM-840, JEOL Ltd. and DigiView, TSL Solutions) and using crystal orientation analysis software (OIM Data Collection and OIM Analysis, EDAX), and the percentage of the area in which the crystal orientation is deviated by 6 degrees or more from the (001) [100] per 1 mm² was determined. Specifically, the reference plane was designated as (001) [100] for "Crystal Orientation," ranges of inclination therefrom were determined, and proportion figures for relevant areas in each range of inclination was determined.
(2) Out-of-Plane Orientation Degree ($\Delta\omega$)

The obtained substrate was analyzed via EBSD and with reference to the "Crystal Direction"<001>//ND using crystal orientation analysis software in the manner described below, so as to determine the out-of-plane orientation degree ($\Delta\omega$).

1. In the crystal coordinate system, the axis <001> is rotated to be aligned with the ND [001] of the sample coordinate system.

2. Thereafter, the degree of inclination of the <001> axis of the crystal coordinate system at each measurement point relative to the ND [001] axis of the sample coordinate system is determined.

3. An inclination at each point is demonstrated on a cumulative graph. An inclination when the number fraction is 0.5 is shown on the vertical axis, and the alignment is designated to be a half that of $\Delta\omega$. Accordingly, a value twice as large as the determined value is designated as the $\Delta\omega$ value.

(3) In-Plane Orientation Degree ($\Delta\varphi$)

The obtained substrate was analyzed via EBSD and with reference to the "crystal direction"<111>//ND using crystal orientation analysis software in the manner described below, so as to determine the in-plane orientation degree ($\Delta\phi$).

1. In the crystal coordinate system, the axis <111> is rotated to be aligned with the ND [001] of the sample coordinate system.

2. Thereafter, the degree of inclination of the <111> axis of the crystal coordinate system at each measurement point relative to the ND [001] axis of the sample coordinate system is determined.

3. An inclination at each point is demonstrated on a cumulative graph. An inclination when the number fraction is 0.5 is shown on the vertical axis, and the alignment is designated to be a half that of $\Delta\phi$. Accordingly, a value twice as large as the determined value is designated as the $\Delta\phi$ value.

In (1) to (3) above, the percentage of the area in which the crystal orientation is deviated by 6 degrees or more from the (001) [100], the $\Delta\omega$ and the $\Delta\phi$ were measured via EBSD at arbitrary 30 points by designating an area to be measured per EBSD as 1 mm², and the averages thereof were calculated.
(4) C-Axis Orientation Rate The obtained substrate was subjected to θ/2θ analysis using an X-ray diffractometer (RINT 2000, Rigaku Corporation), and the c-axis orientation of the (200) plane was determined. Specifically, such value was determined in accordance with the following equation: c-axis orientation rate (%)=I (200)/ΣI (hkl)×100(%).

2. Superconducting Wire

Figure 2:
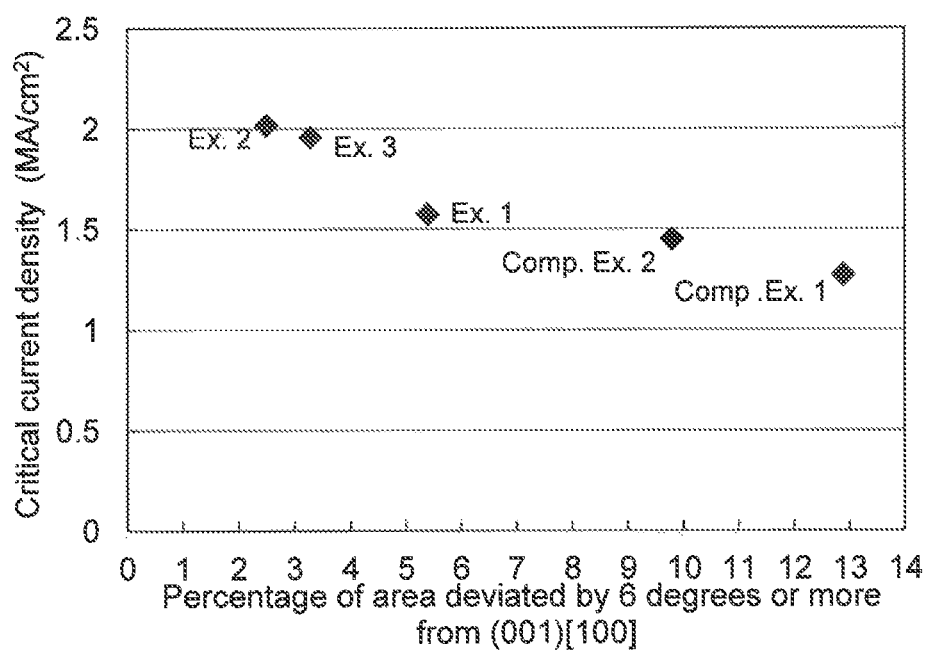
FIG. 2 shows the correlation between the percentage of an area in which the crystal orientation is deviated by 6 degrees or more from the (001) [100] and the critical current density observed in the examples.

Intermediate layers ($CeO_2$, YSZ, $Y_2O_3$) were formed on the substrates obtained in Examples 1 to 3 and Comparative Examples 1 and 2 via RF magnetron sputtering, and superconducting layers (GdBCO) with a thickness of 2.1 μm to 2.3 μm were formed on the intermediate layers via pulse laser deposition (PLD), so as to obtain superconducting wires. The critical current (Ic) of the obtained superconducting wire was measured over a superconducting wire width of 10 mm to determine the critical current density (Jc). The critical current (Ic) was measured at a temperature of 77 K in the self-magnetic field, and the result of measurement was determined to be the current value applied when an electric field of $10^{-6}$ V/cm was generated. The results are shown in Table 1, FIG. 1, and FIG. 2. FIG. 1 shows the correlation between a $\Delta\omega$ or $\Delta\phi$ value and the critical current density, and FIG. 2 shows the correlation between the percentage of an area in which the crystal orientation is deviated by 6 degrees or more from the (001) [100] and the critical current density.

TABLE 1

| | Orientation of Ni layer | | | | | | |
|---|---|---|---|---|---|---|---|
| Substrate | Percentage of area deviated by 6 degrees or more from (001) [100] (%) | Δφ (°) | Δω (°) | c-axis orientation rate | Ic (10 mm) | Superconductive layer thickness (μm) | Jc (MA/cm$^2$) |
| Ex. 1 | 5.4 | 4.78 | 5.44 | 99% or higher | 330 | 2.1 | 1.57 |
| Ex. 2 | 2.5 | 4.71 | 4.94 | 99% or higher | 463 | 2.3 | 2.01 |
| Ex. 3 | 3.3 | 4.67 | 5.34 | 99% or higher | 450 | 2.3 | 1.96 |
| Comp. Ex. 1 | 12.9 | 5.54 | 6.80 | 99% or higher | 267 | 2.1 | 1.27 |
| Comp. Ex. 2 | 9.8 | 5.46 | 6.10 | 99% or higher | 304 | 2.1 | 1.45 |

The results shown in Table 1 demonstrate that the substrate of Example 1 is substantially equivalent to the substrate of Example 2 in terms of the Δφ value and these substrates differ from each other in terms of the Δω value (i.e., a difference of about 0.5 degrees). That is, there is no direct correlation, such as a proportional correlation, therebetween. More specifically, a smaller Δω value does not merely indicate a smaller Δφ value, and a Δω value and a Δφ value are different factors. Also, the substrates of Examples 1 to 3 and the substrate of Comparative Example 1 differ from one another in terms of the Δφ value (i.e., a difference of about 1.3 to 1.9 degrees); however, the difference in terms of the percentage of the area in which the crystal orientation is deviated by 6 degrees or more from the (001) [100] on the outermost layers of the substrate is significant (i.e., a difference of 7.5% or more). This indicates that there is no direct correlation, such as a proportional correlation, between the Δω value and the percentage of the area in which the crystal orientation is deviated by 6 degrees or more from the (001) [100]. More specifically, a smaller Δω value does not merely indicate a smaller percentage of an area in which the crystal orientation is deviated by 6 degrees or more from the (001) [100], and a Δω value and such percentage of the area are different factors. Also, the difference between the substrates of Examples 1 to 3 and the substrate of Comparative Example 1 is not significant in terms of the Δφ value (i.e., a difference of about 0.7 to 0.9 degrees). In contrast, the difference in terms of the percentage of the area in which the crystal orientation is deviated by 6 degrees or more from the (001) [100] on the outermost layer of the substrate is significant (i.e., 7.5% or more). This indicates that there is no direct correlation, such as a proportional correlation, between the Δφ value and the percentage of the area in which the crystal orientation is deviated by 6 degrees or more from the (001) [100]. Specifically, a smaller Δφ value does not merely indicate a smaller percentage of an area in which the crystal orientation is deviated by 6 degrees or more from the (001) [100], and a Δφ value and such percentage of the area are different factors.

As shown in Table 1, FIG. 1, and FIG. 2, improvement in superconductivity (i.e., a higher critical current density) was observed in the superconducting wires manufactured with the use of the substrates of Examples 1 to 3 in comparison with the superconducting wires manufactured with the use of the substrates of Comparative Examples 1 and 2. While the Δφ value exhibited by each of the substrates of Examples 1 to 3 and Comparative Examples 1 and 2 was 6 degrees or less, superconductivity was improved by adjusting the Δω value to 6 degrees or less and the percentage of an area in which the crystal orientation is deviated by 6 degrees or more from the (001) [100] to 6% or less. As a result of comparison of the superconducting wires manufactured with the use of the substrates of Examples 2 and 3 and the superconducting wire manufactured with the use of the substrate of Example 1, a more improvement was observed by adjusting the percentage of an area in which the crystal orientation is deviated by 6 degrees or more from the (001) [100]) to less than 5%.

Example 4

Figure 3:
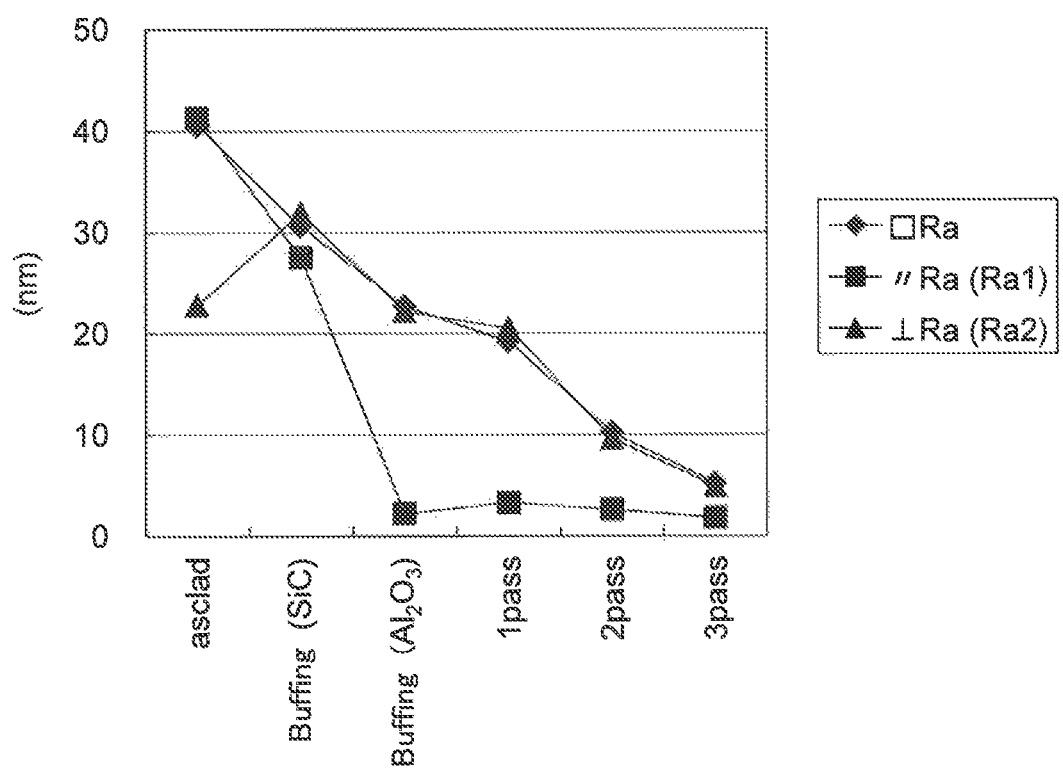
FIG. 3 shows a chart demonstrating changes in surface roughness of a copper layer as a result of polishing.
Figure 4:
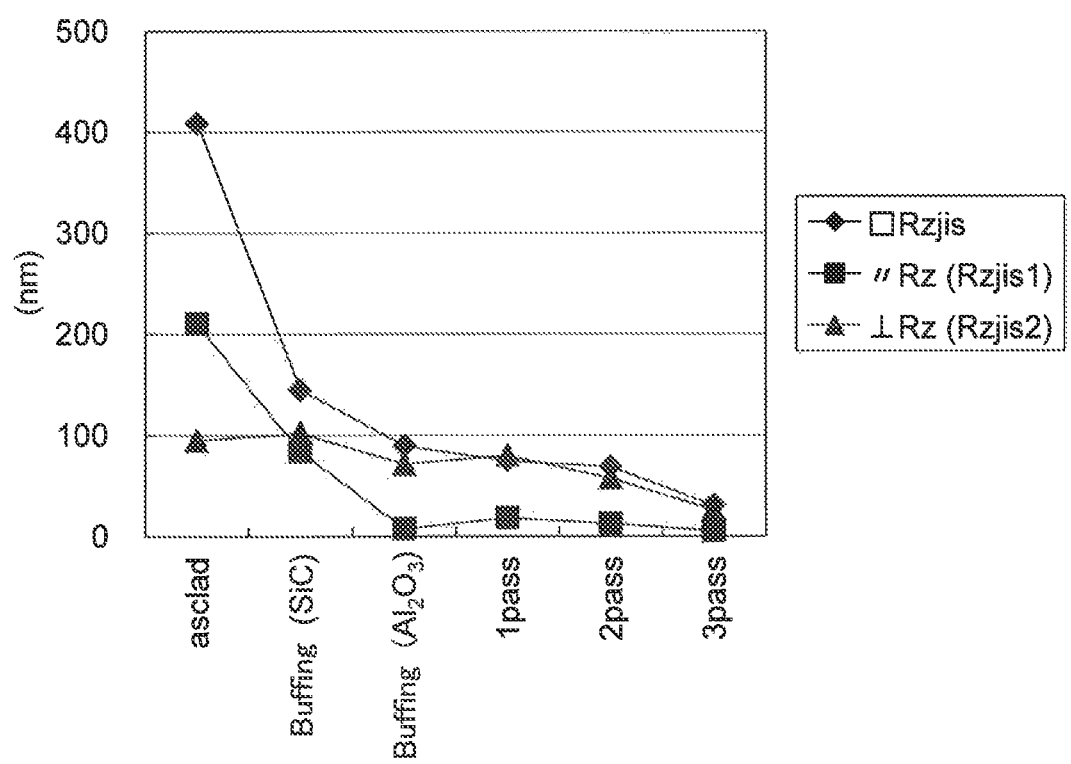
FIG. 4 shows a chart demonstrating changes in surface roughness of a copper layer as a result of polishing.

The laminate was inspected in terms of the correlation between the method of polishing and the surface roughness on the metal layer surface thereof. Specifically, the laminate of SUS316L and the copper foil bonded to each other via surface activation in the same manner as in Example 1 was subjected to roll buffing with SiC abrasive grains in the pressure-rolled direction and then subjected to roll buffing with Al$_2$O$_3$ abrasive grains. Subsequently, light-reduction rolling at a reduction rate of 0.1 to 1% with the use of a mirror roll was performed three times in total. After each polishing process, surface roughness (Ra1, Ra2, Rzjis1, and Rzjis2) per unit length of 10 m and Ra (□Ra) and Rzjis (□Rzjis) per unit area of 10×10 μm$^2$ on the copper layer surface of the laminate were measured with the use of an AFM apparatus (Nano ScopeIIIaD3000, manufactured by Digital Instruments). The results are shown in FIG. 3 and FIG. 4. In FIG. 3 and FIG. 4, "asclad" indicates the condition of the laminate prior to the process of polishing and "1pass" to "3pass" indicates the first to the third light-reduction rolling procedures with the use of a mirror roll.

As shown in FIG. 3 and FIG. 4, the surface roughness of the copper layer was effectively reduced via buffing in combination with light-reduction rolling with the use of a mirror roll. By performing buffing with SiC abrasive grains, followed by buffing with Al$_2$O$_3$ abrasive grains, surface roughness Ra (□Ra) per unit area of 10×10 μm$^2$ on the metal layer surface of the laminate was reduced to 25 nm or less. By further repeatedly performing light-reduction rolling with the use of a mirror roll, surface roughness Ra per unit area of 10×10 μm$^2$ on the metal layer surface of the laminate was reduced to 15 nm or less. By performing buffing with SiC abrasive grains in combination with buffing with Al$_2$O$_3$ abrasive grains, surface roughness Ra1 per unit length of 10 μm in the pressure-rolled direction on the metal layer surface of the laminate was effectively reduced.

Reference Example

An influence of a reduction rate during light-reduction rolling with the use of a mirror roll was inspected.

At the outset, SUS and the copper layer as metal substrates were bonded to each other via surface activation to prepare a SUS/Cu laminate. Subsequently, the copper layer surface was subjected to buffing, so as to reduce the surface roughness of the copper layer surface to the levels of Ra1 of 25 nm and Ra2 of 27 nm (the values measured in an area of 10 μm² using the same AFM apparatus as used in the examples). Subsequently, light-reduction rolling with the use of a mirror roll was performed at a different reduction rate, crystal orientation was performed via thermal treatment at 250° C. for 1 hour, and the crystal orientation degree (Δφ) of the copper layer was measured. A reduction rate was calculated based on a whole plate thickness before light-reduction rolling and that after light-reduction rolling. The results are shown in Table 2.

TABLE 2

| Laminate thickness (mm) | Reduction rate (%) | Crystal orientation degree (Δφ) |
|---|---|---|
| 0.116 | — (w/o light-reduction rolling) | 4.72 |
| 0.116 | 0 | 4.56 |
| 0.113 | 2.6 | 5.72 |

At a reduction rate of 2.6%, surface roughness can be reduced to Ra1 of 15 nm and Ra2 of 16 nm. As shown in Table 2, however, the crystal orientation degree also lowers to a certain extent. At a reduction rate exceeding 2%, distortion is introduced into the copper layer due to pressure rolling, which may adversely affect the copper layer at the time of crystal orientation. Accordingly, a reduction rate is preferably 2% or less, more preferably 1.5% or less, and particularly preferably 1% or less. The laminate shown in Table 2 that had resulting in a reduction rate of 0% was subjected to treatment with a rolling machine designed to achieve a reduction of 0.15 μm. It does not mean that the laminate thickness was not reduced at all, although the difference in the laminate thickness before and after pressure rolling was insignificant (i.e., no difference was observed in the order of μm). Thus, a reduction rate was calculated to be 0% on the basis of the laminate thickness.

All publications, patents, and patent applications cited herein are incorporated herein by reference in their entirety.

The invention claimed is:

1. A substrate for a superconducting wire, wherein the crystal orientation of metals on the outermost layer exhibits a c-axis orientation rate of 99% or higher, a Δω of 6 degrees or less, and a percentage of an area in which the crystal orientation is deviated by 6 degrees or more from the (001) [100] per unit area of 6% or less, wherein the crystal orientation deviation is observed via the electron back scatter diffraction (EBSD) method.

2. The substrate for a superconducting wire according to claim 1, wherein the crystal orientation of metals on the outermost layer exhibits a Δφ of 6 degrees or less.

3. The substrate for a superconducting wire according to claim 2, wherein the crystal orientation of metals on the outermost layer exhibits Δω and Δφ of less than 5 degrees.

4. The substrate for a superconducting wire according to claim 1, wherein the outermost layer is made of copper, nickel, or an alloy thereof.

5. The substrate for a superconducting wire according to claim 1, wherein the substrate for a superconducting wire comprises a non-magnetic metal plate and a metal layer having the outermost layer superposed thereon.

6. The substrate for a superconducting wire according to claim 5, wherein the non-magnetic metal plate is made of stainless steel or a nickel alloy.

7. A method for manufacturing the substrate for a superconducting wire according to claim 1,
the method comprising forming, via thermal treatment, a layer exhibiting a c-axis orientation rate of 99% or higher, a Δω of 6 degrees or less, and a percentage of an area in which the crystal orientation is deviated by 6 degrees or more from the (001) per unit area of 6% or less.

8. A superconducting wire comprising the substrate for a superconducting wire according to claim 1, an intermediate layer superposed thereon, and a superconducting layer superposed thereon.

9. The substrate for a superconducting wire according to claim 1, wherein the substrate for a superconducting wire comprises a non-magnetic metal plate, a layer of copper or a copper alloy superposed on the non-magnetic metal plate, and the outermost protective layer consisting of nickel or a nickel alloy formed on the layer of copper or the copper alloy.

10. The substrate for a superconducting wire according to claim 9, wherein the outermost protective layer consists of a plated film of nickel or the nickel alloy.

* * * * *